United States Patent
Kaise et al.

(10) Patent No.: US 9,305,817 B2
(45) Date of Patent: Apr. 5, 2016

(54) METHOD FOR PURGING A SUBSTRATE CONTAINER

(71) Applicant: TOKYO ELECTRON LIMITED, Tokyo (JP)

(72) Inventors: Seiichi Kaise, Miyagi (JP); Shigeki Amemiya, Miyagi (JP); Shinobu Onodera, Miyagi (JP); Hiroki Fujita, Miyagi (JP); Masaru Nishino, Miyagi (JP); Atsushi Rikukawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 128 days.

(21) Appl. No.: 13/757,954

(22) Filed: Feb. 4, 2013

(65) Prior Publication Data

US 2013/0213442 A1 Aug. 22, 2013

Related U.S. Application Data

(60) Provisional application No. 61/597,257, filed on Feb. 10, 2012.

(30) Foreign Application Priority Data

Feb. 3, 2012 (JP) .................................. 2012-022158

(51) Int. Cl.
   *H01L 21/677* (2006.01)
   *H01L 21/673* (2006.01)
(52) U.S. Cl.
   CPC .... *H01L 21/67772* (2013.01); *H01L 21/67393* (2013.01)

(58) Field of Classification Search
None
See application file for complete search history.

(56) References Cited

U.S. PATENT DOCUMENTS

| 5,988,233 A | 11/1999 | Fosnight et al. |
| 6,899,145 B2 * | 5/2005 | Aggarwal ........................ 141/11 |
| 2001/0041121 A1 * | 11/2001 | Grunes et al. .................. 414/217 |
| 2002/0022088 A1 * | 2/2002 | Wang et al. .............. 427/255.28 |
| 2003/0131902 A1 * | 7/2003 | Dickinson et al. ................. 141/8 |
| 2007/0023322 A1 * | 2/2007 | Hyun et al. .................... 206/711 |
| 2007/0257372 A1 * | 11/2007 | Tada et al. ...................... 257/763 |

FOREIGN PATENT DOCUMENTS

JP 2002-510150 A 4/2002

* cited by examiner

*Primary Examiner* — Nicole Blan
(74) *Attorney, Agent, or Firm* — Rothwell, Figg, Ernst & Manbeck, P.C.

(57) ABSTRACT

A method for purging a substrate container which accommodates in multiple stages a plurality of substrates to be processed by a substrate processing apparatus, the method includes: mounting the substrate container on a mounting unit; connecting a gas supply port provided in the substrate container and a gas supply line provided in a mounting unit; starting supply of a dry gas into the substrate container from a gas supply line before opening a cover of the substrate container; opening the cover of the substrate container while keeping the supply of the dry gas; closing the cover of the substrate container upon completion of processing of the substrates in the substrate container; and stopping the supply of the dry gas after closing the cover of the substrate container.

11 Claims, 11 Drawing Sheets

FIG.8

| RAMP TIME (SECOND) | WAFER | | |
|---|---|---|---|
| | 1ST | 13TH | 25TH |
| 0 | 2 | 2 | 159 |
| 10 | 3 | 0 | 18 |
| 20 | 0 | 1 | 7 |
| 30 | 1 | 0 | 6 |

FIG. 9

| REAR FLOW RATE (mL/min) | FRONT FLOW RATE (mL/min) | | | | | |
|---|---|---|---|---|---|---|
| | 0 | 20 | 30 | 40 | 50 | 60 |
| 30 | 1/2/0 | | 0/1/1 | 2/0/2 | 0/0/15 | 0/2/29 |
| 40 | | 1/1/0 | | 1/1/2 | 1/1/1 | |
| 60 | | | 0/0/1 | 1/2/2 | 1/1/3 | |
| 70 | 0/0/0 | | | | 1/1/1 | |
| 80 | | | 0/0/0 | 1/0/0 | | |
| 90 | | | | | 0/2/5 | 0/0/14 |
| 100 | 1/0/0 | | 0/1/1 | 0/1/1 | 0/0/5 | 0/1/25 |

FIG. 10

| REAR FLOW RATE (mL/min) | FRONT FLOW RATE (mL/min) | | | | | |
|---|---|---|---|---|---|---|
| | 0 | 20 | 30 | 40 | 50 | 60 |
| 30 | 1/2/0 | | 0/0/6 | 1/1/6 | 0/1/5 | 0/1/44 |
| 40 | | | 0/0/1 | 1/0/5 | 0/0/6 | |
| 60 | | | | | | 0/0/10 |
| 70 | 0/0/0 | | 0/0/1 | | | |
| 80 | | | 0/0/4 | 0/0/2 | | 0/1/10 |
| 90 | | | 0/1/5 | 0/2/1 | 2/0/6 | 1/0/3 |
| 100 | 1/0/0 | | 1/1/2 | 0/1/3 | 2/1/2 | 5/0/2 |
| | | | | 0/0/3 | 0/1/8 | 0/0/3 |

METHOD FOR PURGING A SUBSTRATE CONTAINER

CROSS-REFERENCE

This application claims priority to U.S. Provisional Application 61/597,257, filed Feb. 10, 2012, and further claims priority to Japanese Application Numbers 2012-022158, filed Feb. 3, 2012, the entire contents of each of which are hereby incorporated by reference.

FIELD OF THE INVENTION

The present invention relates to a method for purging a container for accommodating a substrate such as a semiconductor wafer or the like.

BACKGROUND OF THE INVENTION

Conventionally, a semiconductor device manufacturing process is performed in a clean room with high cleanliness. However, along with the scaling up of a semiconductor wafer (hereinafter, referred to as "wafer") and various processing apparatuses for processing a wafer, a running cost for the clean room is increased. For this reason, there is recently employed a method for maintaining, at high, only cleanliness in processing apparatuses and in a substrate container, referred to as a FOUP (front opening unified pod) which is used for exchanging wafers between processing apparatuses.

The above-described substrate container is configured to be able to accommodate a plurality of wafers in multiple stages in parallel to each other and configured to load/unload wafers through an opening formed at one side of the substrate container. The substrate container is filled with nitrogen gas of high cleanliness to prevent contaminants such as particles or the like entering the substrate container.

However, the substrate container accommodates a wafer processed by the processing apparatus as well as an unprocessed wafer. Therefore, particles adhered to a wafer in the processing apparatus may be brought into the substrate container. In that case, other wafers are contaminated by the particles, which may lead to deterioration of a product yield.

As for a method for removing particles adhered to a wafer, there is disclosed in, e.g., Patent Document 1 a method for purging the interior of a substrate container by introducing a purge gas of high cleanliness from a lower portion of the substrate container.

RELATED PRIOR ART

[Patent Document 1] Japanese Patent Application Publication No. 2002-510150

SUMMARY OF THE INVENTION

Problem to be Solved

However, even in the case of using the method disclosed in Patent Document 1, the particles may still adhere to a wafer. In this regard, the present inventors have found that the amount of particles changes depending on timing of a purge process in the substrate container.

Further, the present inventors have examined causes of adhesion of particles and have found that particles are generated after a plasma etching process in a semiconductor device manufacturing process. According to the examination of the present inventors, these particles are generated by a gas discharged from a wafer after the plasma etching process.

Estimated causes of generation of particles will be described. In the plasma etching process, for example, $H_2$ gas, $N_2$ gas and CxFy gas are turned into a plasma by a high frequency power, and $NH_4F$ is generated as a by-product by reaction in the plasma. When $NH_4F$ deposited on a silicon wafer reacts with the atmosphere in the substrate container, $(NH_4)_2SiF_6$ is generated. Further, when $(NH_4)_2SiF_6$ reacts with moisture in the atmosphere within the substrate container, $SiO_2$ is generated and this $SiO_2$ is assumed to adhere as particles to the wafer in the substrate container.

The reaction between $(NH_4)_2SiF_6$ and moisture generates HF (hydrofluoric acid) in addition to $SiO_2$, and this causes a problem in which, e.g., a side surface of a trench formed on the wafer by the plasma etching is unnecessarily etched.

Therefore, it is preferable to maintain humidity in the substrate container in a low level in order to prevent gas discharged from the wafer after the plasma etching process from reacting with moisture in the substrate container.

In view of the above, it is an object of the present invention to maintain the interior of a substrate container in a low-humidity state.

Constitutions of the Invention

In order to achieve the object, the present invention provides a method for purging a substrate container which accommodates in multiple stages a plurality of substrates to be processed by a substrate processing apparatus, the method includes: mounting the substrate container on a mounting unit; starting supply of a dry gas into the substrate container from a gas supply line before opening a cover of the substrate container; opening the cover of the substrate container while keeping the supply of the dry gas; closing the cover of the substrate container upon completion of processing of the substrates in the substrate container; and stopping the supply of the dry gas after closing the cover of the substrate container.

In accordance with the present invention, the dry gas is supplied into the substrate container before the cover of the substrate container is opened, and the cover of the substrate container is opened in a state where the supply of the dry gas is continued. Therefore, the inside of the substrate container is maintained in a dry state. Further, the dry gas is supplied until the cover is closed upon completion of the processing of the wafer in the substrate container, so that the inside of the substrate container is maintained in a dry state even after the cover is closed. As a result, even if gas that causes generation of particles or unnecessary etching is discharged from the wafer that has been subjected to the plasma etching, the generation of $SiO_2$ or hydrofluoric acid which is caused by the reaction between the gas and moisture in the substrate container does not occur. Accordingly, the substrates in the substrate container can be maintained in a good state.

The dry gas may be supplied at a first flow rate before opening the cover of the substrate container; the cover of the substrate container may be opened while supplying the dry gas at a second flow rate lower than the first flow rate; and the supply of the dry gas at the second flow rate may be continued at least until the cover of the substrate container is closed.

The gas supply line may be purged with the dry gas before the substrate container is mounted on the mounting unit.

The gas supply port may be formed at a bottom portion of the substrate container, and the dry gas supplied into the substrate container may be discharged via a gas exhaust port formed at a lower portion of the substrate container.

The gas supply port may be provided with a distribution line for distributing the dry gas between the substrates in the substrate container, and the dry gas may be supplied into the substrate container through the distribution line.

The gas supply port may be formed at a ceiling portion of the substrate container, and the dry gas supplied into the substrate container may be discharged via a gas exhaust port formed at an upper portion of the substrate container.

Effect of the Invention

In accordance with the present invention, the interior of the substrate container can be maintained in a low-humidity state.

BRIEF DESCRIPTION OF THE DRAWINGS

FIG. 8 is a view for explaining relationship between ramp time and the number of counted particles.

FIG. 9 is a view for explaining relationship between the number of particles and a flow rate of dry gas in the case of not controlling ramping.

FIG. 10 is a view for explaining relationship between the number of particles and a flow rate of dry gas in the case of controlling ramping.

DETAILED DESCRIPTION OF THE EMBODIMENTS

Figure 1:
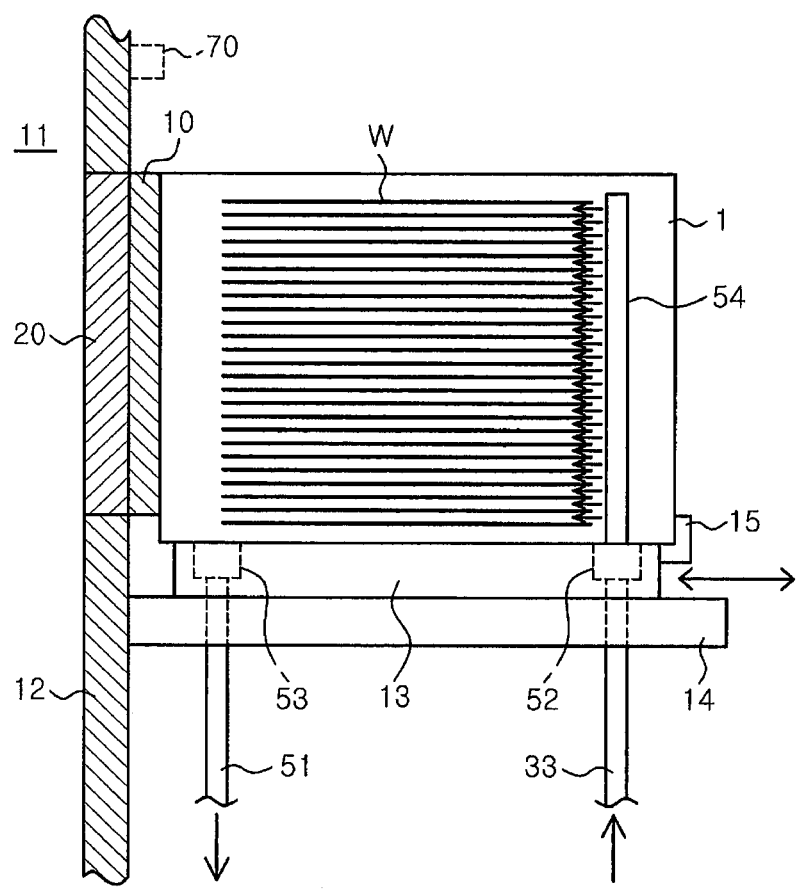
FIG. 1 is a schematic vertical sectional view showing an example of a configuration near a substrate container that embodies the present invention.

Hereinafter, an embodiment of the present invention will be described with reference to the accompanying drawings. FIG. 1 is a schematic vertical sectional view showing an example of a schematic configuration of a substrate container 1 to which a purging method in accordance with an embodiment of the present invention is applied.

A substrate container 1 is formed in a box shape having an opening at a front portion thereof and has a cover 10 for airtightly sealing the opening. The bottom surface of the substrate container 1 is supported by a mounting table 13, serving as a mounting unit, provided at an outer side of a partition wall 12 forming a transfer chamber 11 of a wafer processing apparatus. The substrate container 1 is transferred from the outside of the wafer processing apparatus by, e.g., a transfer unit (not shown) and mounted on the top surface of the mounting table 13. Further, a gas flow directed from an upper portion to a lower portion, i.e., a so-called down flow is formed in the transfer chamber 11.

The mounting table 13 is supported by a supporting member 14 provided at an outer surface of the partition wall 12. The mounting table 13 is horizontally movable on the support member 14 by a moving mechanism (not shown), so that the mounting table 13 can be moved back and forth with respect to the partition wall 12, together with the substrate container 1.

A stopper 15 is provided at a rear side of the mounting table 13. The mounting table 13 and the substrate container 1 can be locked (clamped) at a predetermined position by the stopper 15.

The cover 10 has an interlocking member (not shown). The cover 10 and the substrate container 1 are interlocked (latched) by the interlocking member. Further, a port door 20 is provided at a position of the partition wall 12 which corresponds to the cover 10. The port door 20 is configured to hold the cover 10 by bringing the cover 10 into contact with the port door 20 (by docking the cover 10 to the port door 20) by moving the mounting table 13. The port door 20 can be opened and closed by a driving device (not shown). Therefore, the cover 10 can be opened and closed by opening and closing the port door 20 in a state where the port door 20 and the cover 10 are brought into contact with each other.

The substrate container 1 accommodates, e.g., 25 wafers W, to be processed by the wafer processing apparatus. The wafers W are horizontally arranged in multiple stages at regular intervals in the substrate container 1.

Figure 2:
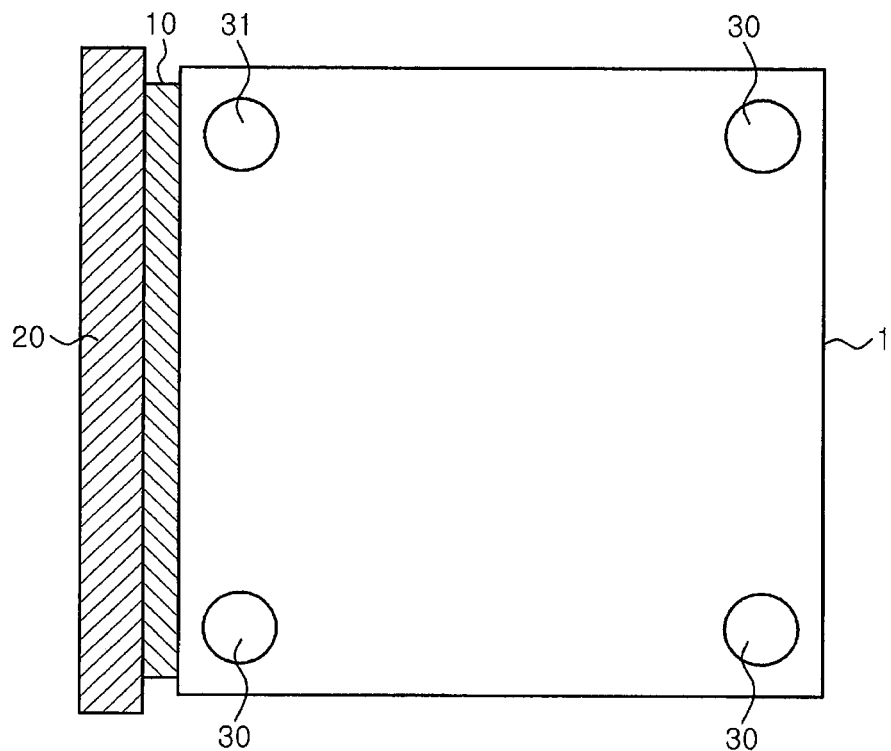
FIG. 2 is a schematic horizontal sectional view showing an example of a configuration near a substrate container that embodies the present invention.

As shown in FIG. 2, for example, three gas supply ports 30 and a single gas exhaust port 31 are provided at four corners of the bottom portion of the substrate container 1. In the present embodiment, two of the gas supply ports 30 are positioned at the opposite side of the cover 10, and the remaining one gas supply port 30 is positioned at the cover 10 side. The gas exhaust port 31 is positioned at the cover 10 side.

Figure 3:
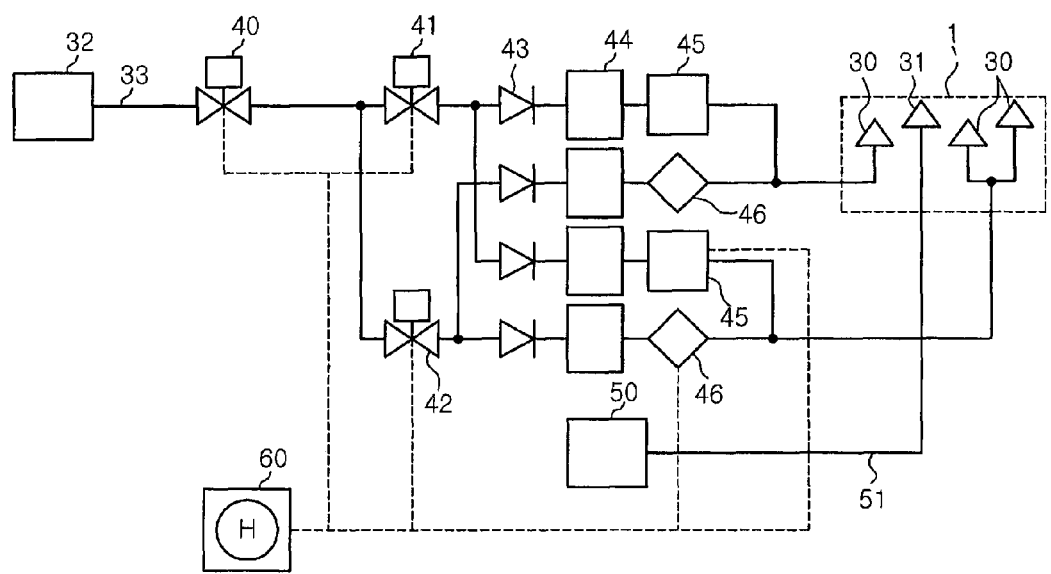
FIG. 3 is a systematic diagram showing a system for supplying and exhausting a gas to and from a substrate container.

As shown in FIG. 3, a gas supply source 32, for supplying a purge gas, e.g., dry nitrogen gas, is connected to the gas supply ports 30 via a gas supply line 33. Provided on the gas supply line 33 is a cut-off valve 40 for controlling gas supply and cut-off of the gas supply from the gas supply source 32. The gas supply line 33 branches into two lines at a downstream side of the cut-off valve 40. The two gas supply lines 33 are provided with cut-off valves 41 and 42, respectively. Each of the two gas supply lines 33 branches again into two lines at downstream sides of the cut-off valves 41 and 42. Each of the four gas supply lines 33 is provided with a check valve 43 and a flowmeter 44. For example, a flow rate control unit 45 which controls the dry gas to flow at a first flow rate is provided at the downstream side of the cut-off valve 41, and a flow rate control unit 46 which controls the dry gas to flow at a second flow rate smaller than the first flow rate is provided at the downstream side of the cut-off valve 42.

Each of the gas supply lines 33 having the flow rate control unit 45 joins one of the gas supply lines 33 having the flow rate control unit 46 at the downstream side of the flow rate control units 45 and 46. One of the confluent gas supply lines 33 is connected to, e.g., two of the gas supply ports 30, and the other confluent gas supply line 33 is connected to the remaining one gas supply port 30. Accordingly, for example, when the cut-off valve 41 is opened and the cut-off valve 42 is closed, the purge gas is supplied at the first flow rate from the gas supply ports 30. In a reverse case, the purge gas is supplied at the second flow rate. The line system between the gas supply source 32 and the gas supply ports 30 is not limited to that of the present embodiment. For example, the line system may be configured to individually control the flow rate with respect to each of the gas supply ports 30 or may have an arbitrary configuration.

The gas exhaust port 31 is connected to a gas exhaust unit 50 via a gas exhaust line 51, so that the gas supplied from the gas supply ports 30 can be exhausted.

As shown in FIG. 1, purge nozzles 52 and an intake nozzle embedded in the mounting table 13 are respectively connected to ends of the gas supply line 33 and the gas exhaust line 51 near the substrate container 1. The purge nozzles 52 are located at positions corresponding to the gas supply ports 30, and the intake nozzle 53 is located at a position corresponding to the gas exhaust port 31. The purge nozzle 52 and the intake nozzle 53 are configured to be vertically movable by a driving device (not shown). The purge nozzle 52 in a raised position serves to allow the gas from the gas supply line 33 to flow to the substrate container 1 and serves to block gas flow in a reverse direction thereof. The intake nozzle 53 in a raised position serves to allow the gas flowing from the substrate container 1 to flow through the gas exhaust port 31 and serves to block gas flow in a reverse direction thereof. The purge nozzle 52 and the intake nozzle 53 are configured to be airtightly connected to the gas supply ports 30 and the gas exhaust port 31 by mounting the substrate container 1 on the mounting table 13.

The two gas supply ports 30 provided at the opposite side of the cover 10 are provided with snorkels 54 serving as distribution lines extending vertically upward in the substrate container 1. The snorkels 54 are provided with, e.g., slit-shaped openings (not shown) that are formed on a surface facing the wafers W at heights corresponding to the gaps between the wafers W, so that the gas supplied from the gas supply port 30 can be uniformly distributed between the wafers W. Accordingly, a gas flow that uniformly runs between the wafers W in the substrate container 1 toward the cover 10 can be formed in the substrate container 1. As a result, even if the cover 10 is in an open state, the inflow of the atmosphere in the transfer chamber 11 into the substrate container 1 can be prevented by the gas flow. Further, particulars such as the arrangement of the gas supply port 30 or the gas exhaust port and the presence or absence of the snorkels 54 are not limited to those of the present embodiment. As long as the inflow of the atmosphere in the transfer chamber 11 into the substrate container 1 can be prevented by forming the gas flow directed from the inside of the substrate container 1 toward the cover 10, any configuration may be used. For example, there may be provided two gas supply ports 30 and two gas exhaust ports 31.

The aforementioned cut-off valves 40, 41 and 42 and the flow rate control units 45 and 46 are controlled by a control device 60. The control device 60 includes a computer having a CPU, a memory and the like. The control device, for example, executes a program stored in the memory to purge the substrate container 1. Various programs for performing such operations are stored in a storage medium H, e.g., a computer readable hard disk (HD), a flexible disk (FD), a compact disk (CD), a magnetic optical disk (MO), a memory card or the like, and installed in the control device 60 from the storage medium H.

Figure 4:
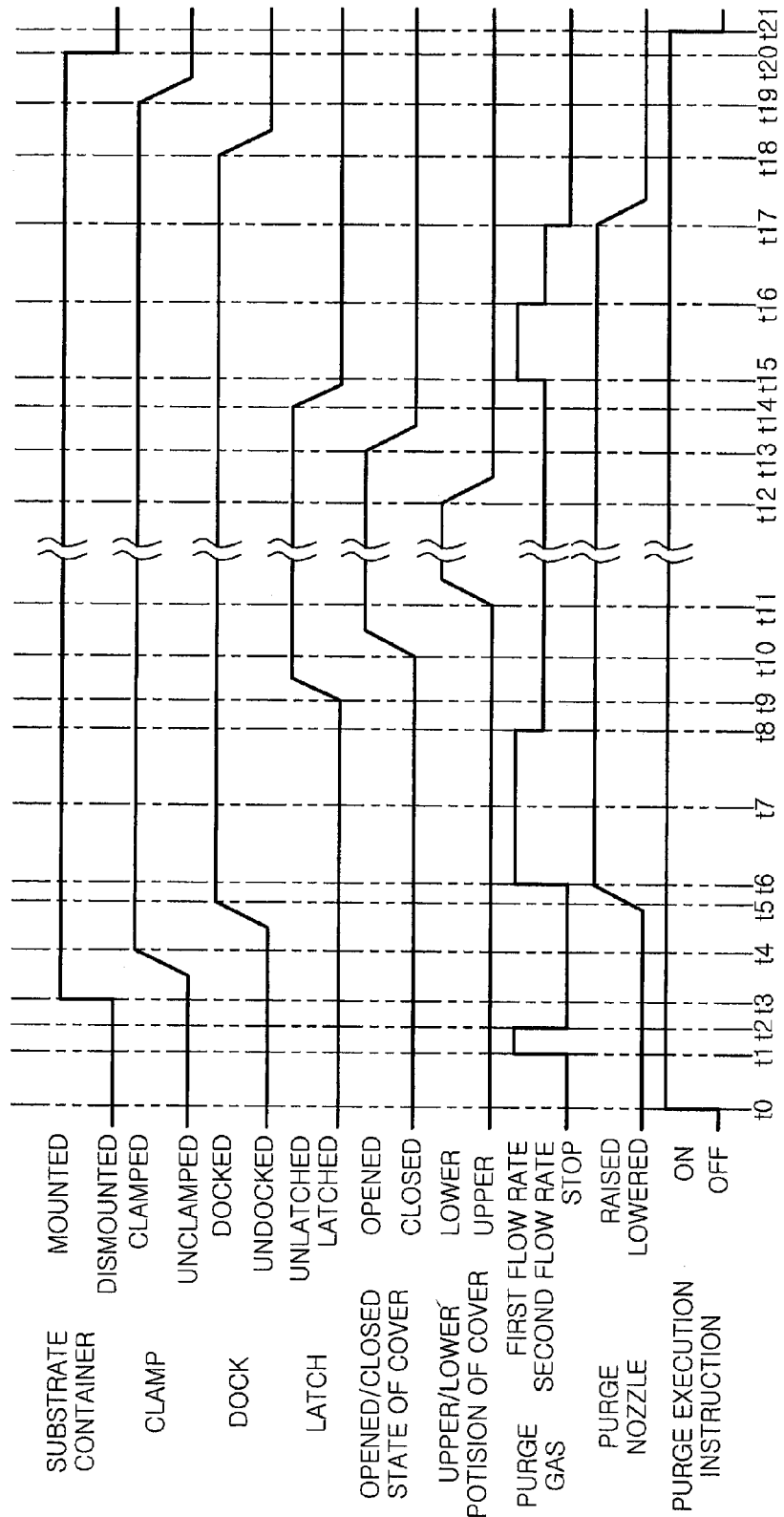
FIG. 4 is a time chart showing an example of a purging method in accordance with an embodiment of the present invention.

The substrate container 1 of the present embodiment is configured as described above. Hereinafter, a method for purging the substrate container 1 will be described. FIG. 4 is a time chart showing an example of processes of the purging method, wherein the horizontal axis indicates time and the vertical axis indicates a state of each device.

In order to purge the substrate container 1, a purge execution instruction is outputted from the control device 60 (time t0 in FIG. 4) before the substrate container 1 is mounted on the mounting table 13. Further, the cut-off valves 40 and 41 are made to be opened for a predetermined period of time by the purge execution instruction. As a consequence, the purge gas is supplied at a first flow rate, e.g., about 50 L/min, and particles in the gas supply line 33 and the purge nozzle 52 are removed by pre-purge (times t1 to t2 in FIG. 4). In this way, by performing pre-purging before mounting the substrate container 1 on the mounting table 13, particles adhered to, e.g., the gas supply line 33 or the purge nozzle are prevented from entering the substrate container 1. During the pre-purging, nitrogen gas is diffused around the gas supply line 33. Therefore, in order to prevent an operator in the vicinity from being suffocated, for example, a sensor 70 for detecting access of a person to the gas supply line 33 is installed at, e.g., the partition wall 12 above the port door 20, as indicated by a dashed line in FIG. 1. Further, it is preferable to provide an inter-lock that forcibly stops the pre-purging when a person is detected by the sensor 70. Alternatively, the sensor 70 may be an oximeter, and an inter-lock may be provided in accordance with an oxygen concentration.

When the pre-purging is completed, the substrate container 1 is mounted on the mounting table 13 (time t3 in FIG. 4). Next, the substrate container 1 is locked (clamped) to the mounting table 13 by the stopper 15 (time t4 in FIG. 4). Thereafter, the mounting table 13 is moved toward the partition wall 12, and the cover 10 of the substrate container 1 is brought into contact with (docked to) the port door 20 (time t5 in FIG. 4).

Then, the purge nozzle 52 and the intake nozzle 53 are raised, and the gas supply line 33 and the gas exhaust line 51 communicate with the substrate container 1 (time t6 in FIG. 4). Thereafter, the cut-off valves 40 and 41 are made to be opened, and the purge gas is supplied at the first flow rate for a predetermined period of time, e.g., 100 seconds, from the gas supply port 30 into the substrate container 1. The purge gas in the substrate container 1 is discharged via the gas exhaust port 31. Accordingly, the inside of the substrate container 1 is replaced by a dry nitrogen atmosphere, and the humidity in the substrate container 1 is maintained at, e.g., 5% or less (times t7 to t8 in FIG. 4). The first flow rate and the purge time can be obtained by previously performing a test for maintaining the humidity in the substrate container 1 at 5% or less.

Next, by closing the cut-off valve 41 and opening the cut-off valve 42, the flow rate of the purge gas supplied into the substrate container 1 is reduced to the second flow rate, e.g., 10 L/min (time t8 in FIG. 4). The reason of reducing the flow rate of the purge gas at time t8 is to prevent the cover 10 from being opened at an undesired timing due to a pressure difference between the inside of the substrate container 1 and the transfer chamber 11, when the cover 10 is later opened. During times t7 to t8, a so-called leak check, which checks whether or not the purge gas leaks to the outside from the substrate container 1, is also carried out.

Figure 5:
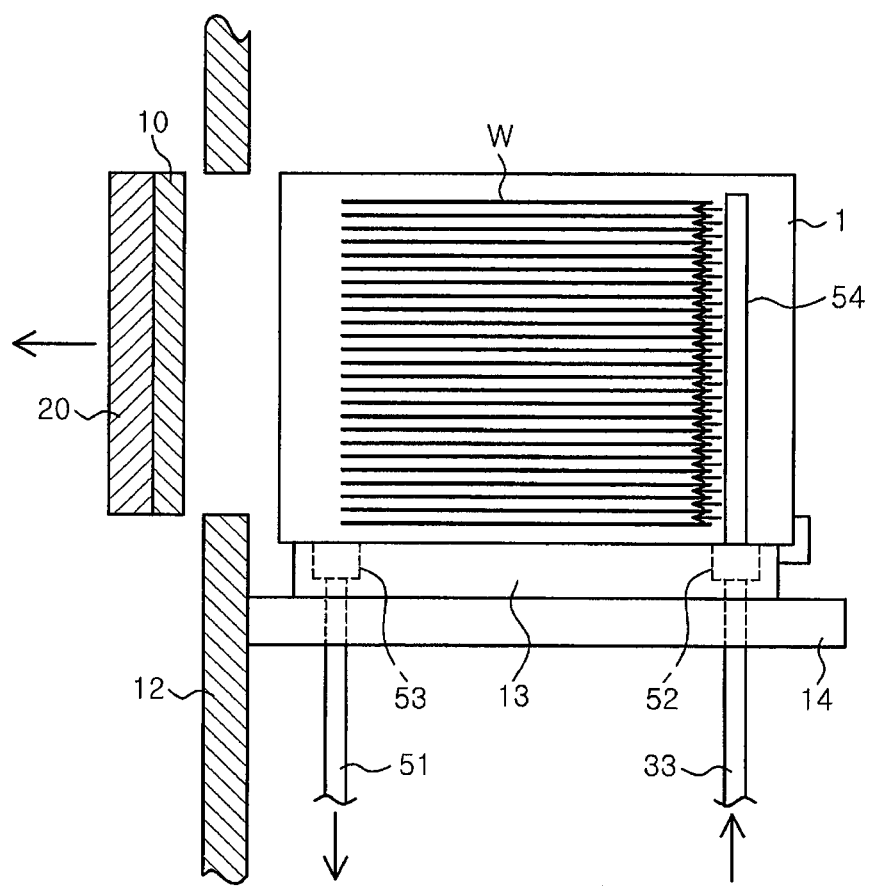
FIG. 5 is a view for explaining a state in which a cover of a substrate container is opened.

Then, the latch of the cover 10 is released (unlatched) in a state where the purge is continued at the second flow rate (time t9 in FIG. 4). Next, as shown in FIG. 5, the cover 10 is horizontally moved toward the transfer chamber 11 by a driving device (not shown), thereby opening the substrate container 1 (time t10 in FIG. 4). The cover 10 that has been moved in the horizontal direction is then moved downward (time t11 in FIG. 4), so that a transfer unit (not shown) provided in the transfer chamber 11 can access the wafers W in the substrate container 1. In the meantime, the humidity in the substrate container 1 is maintained at, e.g., 25% or less, by the purge gas. The second flow rate is determined based on the previously performed test or the like.

When all the wafers W are again accommodated in the substrate container 1 after they have been sequentially subjected to the plasma etching by the wafer processing apparatus and the process of all the wafers W has been completed, the cover 10 can be closed. Specifically, the cover 10 and the port door 20 are together moved upward (time t12 in FIG. 4) and then moved horizontally toward the substrate container 1 (time t13 in FIG. 4).

Next, the cover 10 is latched, and the substrate container 1 is sealed by the cover 10 (time t14 in FIG. 4). After the substrate container 1 is sealed, the cut-off valve 42 is closed and the cut-off valve 41 is made to be opened. Accordingly, the purge gas is supplied at the first flow rate into the substrate container 1 to perform post-purge (times t15 to t17 in FIG. 4). During the post-purge, the flow rate of the purge gas is reduced to the second flow rate after a predetermined period of time (times t15 to t16 in FIG. 4) elapses. The period of time from t15 to t16 is a time period required for decreasing the humidity in the substrate container 1 to about 5% or less by the purge and previously obtained by a test or the like. Alternatively, a hygrometer may be provided on the gas exhaust line 51 to measure the humidity. Then, the supply of the purge gas is stopped and the purge nozzle 52 and the intake nozzle 53 are lowered (t17 in FIG. 4) to maintain the substrate container 1 in a sealed state.

Next, the mounting table 13 is moved to the opposite side of the partition wall 12, and the cover 10 of the substrate container 1 and the port door 20 are separated (undocked) from each other (t18 in FIG. 4). Then, the substrate container 1 and the mounting table 13 are unlocked (unclamped) (t19 in FIG. 4). Thereafter, the substrate container 1 is removed from the mounting table 13 (t20 in FIG. 4) and transferred to a processing apparatus for performing another process on the wafers W.

When the substrate container 1 is removed from the mounting table 13, the purge execution instruction from the control device 60 is stopped (t21 in FIG. 4), thereby completing a series of purging processes.

In accordance with the above embodiment, the supply of the dry gas into the substrate container 1 is started before the cover 10 of the substrate container 1 is opened, and the cover 10 of the substrate container 1 is opened in a state where the dry gas is continuously supplied. Accordingly, the inside of the substrate container 1 is maintained in a dry state. Further, the dry gas is supplied until the cover 10 is closed upon completion of the processing of the wafers W in the substrate container 1. Thus, even after the cover 10 is closed, the inside of the substrate container 1 is maintained in a dry state. As a result, even if gas that causes generation of particles or unnecessary etching is discharged from the wafer W that has been subjected to the plasma etching, the generation of $SiO_2$ or hydrofluoric acid which is caused by the reaction between the gas and moisture in the substrate container does not occur. Hence, the wafers W in the substrate container can be maintained in a good state.

Further, the purge is performed at the first flow rate greater than the second flow rate before the cover 10 of the substrate container 1 is opened, so that the inside of the substrate container 1 can be replaced by a dry gas atmosphere in a short time.

Further, since the snorkels 54 is provided in the substrate container 1 and the dry gas is distributed and supplied between the wafers W, the surfaces of the wafers W can be maintained under a dry gas atmosphere. For this reason, even if the atmosphere of the transfer chamber 1 flows into the substrate container 1 and $SiO_2$ or hydrofluoric acid is generated by reaction between the gas discharged from the wafer W that has been subjected to plasma etching and moisture contained in the atmosphere of the transfer chamber 11, the wafers W are not affected. Particularly, the flow of the dry gas toward the cover 10 is formed by the snorkels 54, so that the atmosphere of the transfer chamber 11 which flows into the substrate container 1 from the side of the cover 10 can be more reliably prevented from reaching the surfaces of the wafers W.

In the above-described embodiment, the dry gas is uniformly supplied between the wafers W by the snorkels 54. However, an upper opening of the oxygen tank may be set to be larger than an intermediate opening and a lower opening of the oxygen tank, so that the flow rate of the dry gas flowing in the upper portion of the substrate container 1 is increased. In that case, the flow rate of the dry gas passing over top surfaces of the wafers W arranged at the upper portion of the substrate container 1 and flowing downward toward the gas exhaust port 31 is increased. Accordingly, due to the downwardly flowing dry gas, the down flow of the dry gas is formed near the opening of the substrate container 1. Such down flow functions as an air curtain, so that the inflow of the atmosphere from the transfer chamber 11 into the substrate container 1 can be reduced.

In the above-described embodiment, the dry gas is supplied at the same flow rate from each of the gas supply ports 30. However, the flow rate of the gas from each gas supply port may be individually set. Particularly, the present inventors have found that the adhesion of particles to the wafers W can be reduced by setting the flow rate of the dry gas supplied from the gas supply port 30 located at the cover 10 side to be smaller than that of the gas supplied from the gas supply ports 30 located at the opposite side of the cover 10. This is because if the flow rate of the dry gas supplied from the gas supply port 30 located at the cover 10 side is large, when the particles adhered to the inside of the substrate container 1 re-scatter by the purge, the discharge of the particles to the outside of the substrate container 1 may be disturbed by the above-mentioned air curtain formed near the opening of the substrate container 1. It has been also found that it is preferable to set the first flow rate of the dry gas supplied from the gas supply port 30 located at the opposite side of the cover 10 to be 50 L/min or less. This is because if the first flow rate is increased, the re-scattering of the particles adhered to the inside of the substrate container 1 is also increased. The relationship between the flow rate of the dry gas supplied from each of the gas supply ports 30 and the adhesion of the particles to the wafer W will be described later.

At times t1 to t2, the pre-purge of the purge nozzle 52 is performed at the first flow rate. However, the flow rate of the dry gas during the pre-purge is not limited to the first flow rate and may be arbitrarily set.

In the above-described embodiment, the flow rate of the dry gas as the purge gas supplied into the substrate container 1 is instantly changed as shown in, e.g., FIG. 4, by opening and closing the cut-off vales 41 and 42. However, the flow rate of the dry gas may be gradually increased for a predetermined period of time by using, e.g., a ramping control or the like. The present inventors have found from the following test that the adhesion of the particles to the wafer W can be further suppressed by gradually increasing the flow rate of the dry gas by the ramping control. This is because the re-scattering, by the purge, of the particles adhered to the inside of the substrate container 1 can be suppressed by gradually increasing the flow rate of the dry gas.

Figure 6:
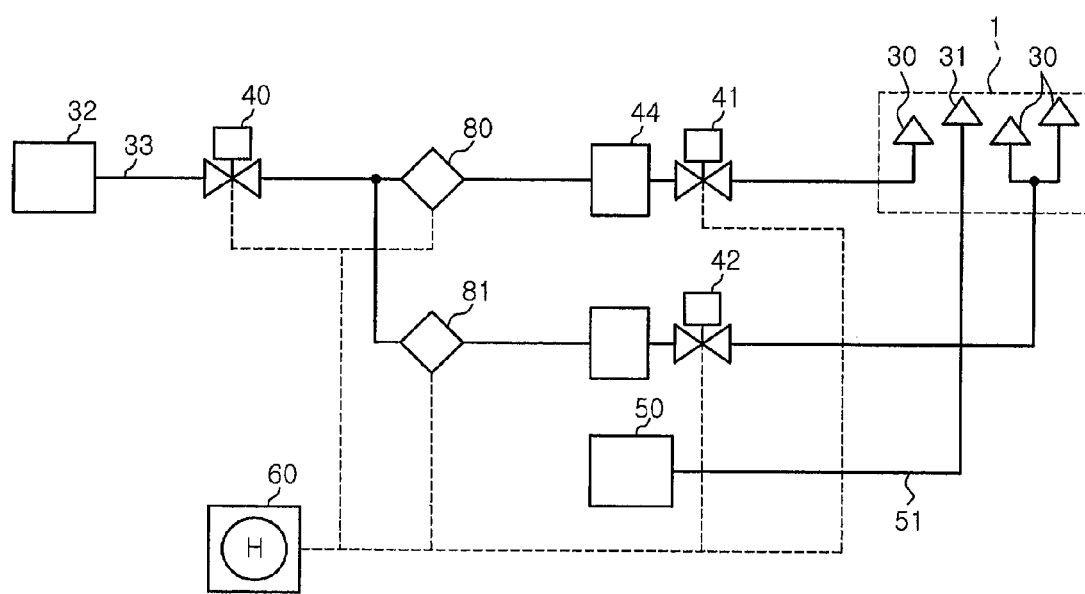
FIG. 6 is a systematic diagram showing a system for supplying and exhausting a gas to and from a substrate container in accordance with another embodiment of the present invention.

For example, in the gas supply/exhaust system shown in FIG. 3, the gas supply line 33 branches at the downstream side of the cut-off valve 40 and further branches at the downstream of the cut-off valves 41 and 42. The branched gas supply lines are respectively provided with two flow rate control units 45 and two flow rate control units 46. However, when the flow rate of the dry gas is ramp-controlled, for example, flow rate control units 80 and 81 may be installed at a gas supply line 33a communicating with the gas supply port 30 located at the cover 10 side and a gas supply line 33b communicating with the gas supply ports 30 located at the opposite side of the cover 10, respectively, without dividing the gas supply line 33 at the downstream of the cut-off valves 41 and 42, as shown in FIG. 6.

Figure 7:
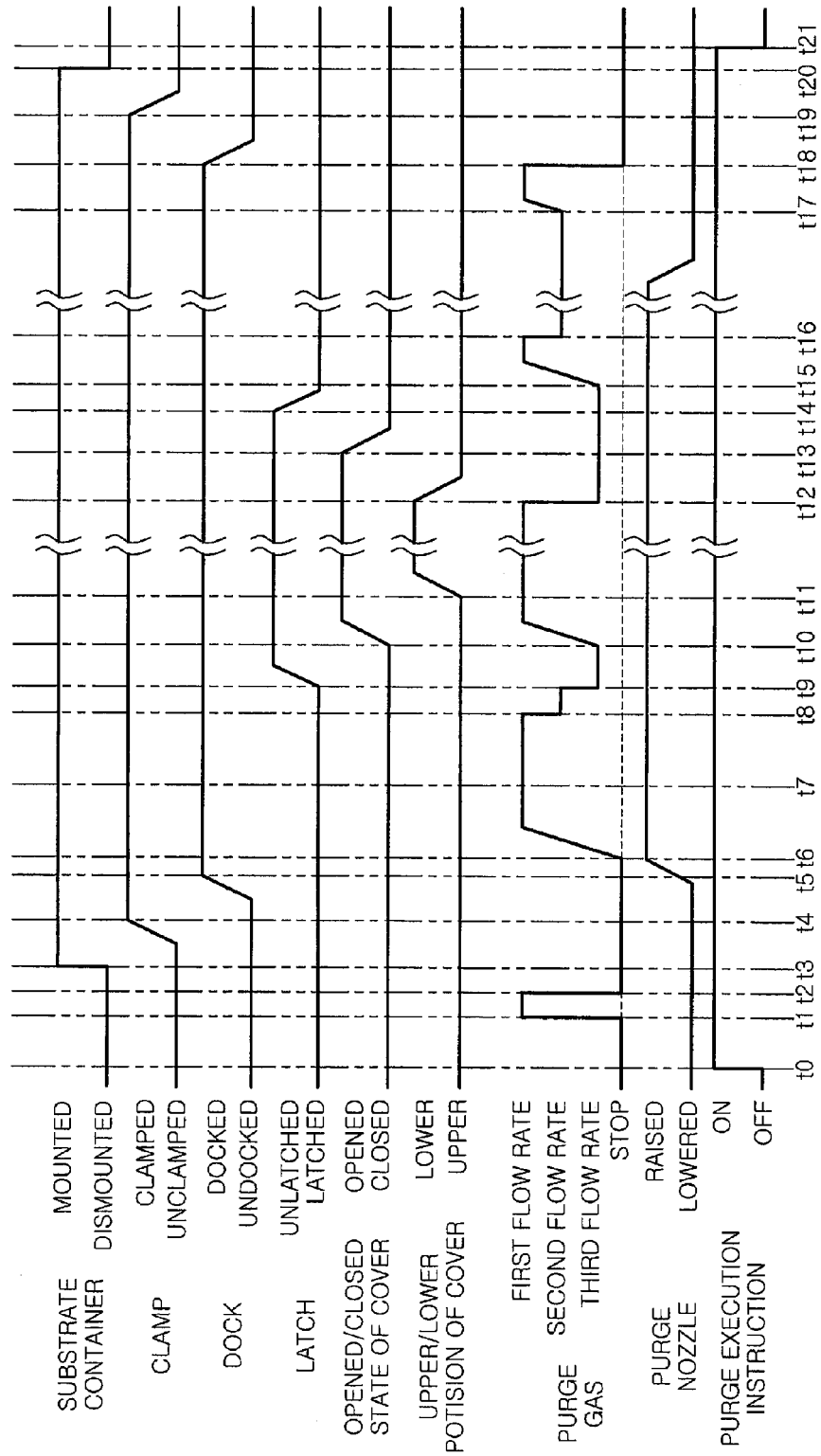
FIG. 7 is a time chart showing an example of a purging method in accordance with another embodiment of the present invention.

Hereinafter, an example of a method for purging the substrate container 1 by using the gas supply/exhaust system shown in FIG. 6 will be described. FIG. 7 is a time chart showing an example of processes of the purge method. In the following, the differences from the time chart shown in FIG. 4 will be mainly described, and the description of the same details as FIG. 4 will be omitted.

At time t5 in FIG. 7, the cover 10 of the substrate container 1 and the port door 20 are docked with each other and thus the gas supply line 33 and the gas exhaust line 51 communicate with the substrate container 1. At time t6, the dry gas is supplied at the first flow rate into the substrate container 1. At this time, the flow rate control units 80 and 81 are controlled by the control device 60. Accordingly, the flow rate of the dry gas is gradually increased at a predetermined ramp rate and reaches the first flow rate.

Next, at time t8, the flow rate of the dry gas is decreased to the second flow rate. At this time, since it does not have to consider the re-scattering of the particles by the purge, the flow rate of the dry gas may be instantly decreased to the second flow rate unlike the case of increasing the flow rate. Further, in order to prevent undesired operation of the cover 10 caused by the pressure difference between the substrate container 1 and the transfer chamber 11 as described above, the flow rate of the dry gas may be set to a third flow rate smaller than the second flow rate shown in FIG. 4 after time t8, e.g., at time t9. In that case, the flow rate may be returned to the second flow rate after the substrate container is opened by the operation of the cover 10 at time t10. Alternatively, the flow rate of the dry gas may be returned to the first flow rate or set to any level greater than the third flow rate as long as the inside of the substrate container 1 is maintained in a dry state. In that case as well, the flow rate of the dry gas is gradually increased at a predetermined ramp rate. In the present embodiment, the case, as shown in FIG. 6, in which the flow rate of the dry gas is returned to the first flow rate at time t10 after the substrate container 1 is opened will be described as an example.

Next, when all the wafers W in the substrate container 1 are completely processed and again accommodated in the substrate container 1, the flow rate of the dry gas is decreased to the flow rate lower than the second flow rate, e.g., to the third flow rate, at time t12 before the cover 10 is closed at time t13.

When the cover 10 is closed, the flow rate of the dry gas is increased from the third flow rate and the post purge is performed at the first and the second flow rate at time t15 to t17. In that case as well, the flow rate of the dry gas is increased at a predetermined ramp rate. Further, the substrate container 1 may stand by on the mounting table 13, depending on the operation state of the wafer processing apparatus, even after the cover 10 is closed. In that case, the substrate container 1 stands by in a state where the flow rate of the dry gas is decreased to the second flow rate, e.g., as shown from time t16 to t17 in FIG. 7. However, when the substrate container 1 is undocked, a second purge may be performed at the first flow rate at, e.g., time t17. By doing so, the inside of the substrate container 1 can be reliably maintained in a dry atmosphere. The second purge does not have to be necessarily performed. Especially, when the substrate container 1 is undocked within a predetermined period of time after the cover 10 is closed, the dry state in the substrate container 1 is sufficiently maintained and, therefore, the second purge is unnecessary.

In accordance with the above embodiment, the flow rate of the dry gas supplied into the substrate container 1 is gradually increased at a predetermined ramp rate. Therefore, the abrupt supply of the dry gas into the substrate container 1 can be prevented. As a consequence, the re-scattering of the particles adhered to the inside of the substrate container 1 can be suppressed.

The ramp rate at which the flow rate of the dry gas is increased may be arbitrarily set. For example, the ramp rate may be determined by a previously performed test or the like.

Hereinafter, the result verified by the present inventors on the effect obtained in the case of increasing the flow rate of the dry gas at a predetermined ramp rate will be described. FIG. 8 is a graph showing a result of counting the number of particles adhered to the wafer W in the case of gradually increasing the flow rate of the dry gas supplied from the gas supply port 30 located at the cover 10 side to about 60 mL/min and the flow rate of the dry gas supplied from the gas supply port 30 located at the opposite side of the cover 10 to about 100 mL/min by using the flow rate control units 80 and 81 shown in FIG. 6. At that time, the arrival time to the respective flow rates was 10 seconds, 20 seconds and 30 seconds. For comparison, the number of particles was counted in the case where the arrival time to the respective flow rates was zero, i.e., in the case where the flow rate of the dry gas was adjusted by the operation of the cut-off valves 41 and 42 as shown in FIG. 3. Further, the particles having a diameter of about 0.09 µm or above were counted. Among twenty-five wafers accommodated in the substrate container 1, the $1^{st}$ wafer, the $13^{th}$ wafer and the $25^{th}$ wafer from the bottom were set as wafers W as counting targets.

It has been found that when the flow rate of the dry gas was gradually increased by the ramping control as shown in FIG. 8, the number of particles adhered to the $25^{th}$ wafer W was greatly reduced compared to when the flow rate of the dry gas was instantly increased. The $25^{th}$ wafer is an uppermost wafer W, and it is considered that the adhesion of particles to the $25^{th}$ wafer is caused by re-scattering. Therefore, it has been found that the re-scattering of the particles is suppressed by the ramping control. Further, the present inventors have found that the effect of the ramping control can be obtained even when only the flow rate of the dry gas supplied from the gas supply port 30 at the cover 10 side is ramp-controlled. The reason is assumed as follows.

An air curtain that suppresses the inflow of the atmosphere from the transfer chamber 11 into the substrate container 1 is formed near the opening of the substrate container 1 due to the flow of the dry gas supplied from the gas supply port 30 at the cover 10 side. The air curtain also has a function of suppressing discharge of the dry gas, supplied from the gas supply port 30 at the opposite side of the cover 10, into the transfer chamber 11. If the ramping control is performed during the supply of the dry gas from the gas supply port 30 at the cover 10 side, the air curtain is not sufficiently formed in an initial stage of the supply of the dry gas since the flow rate of the dry gas is low in the initial stage. At this time, if the dry gas is instantly supplied from the gas supply port 30 at the opposite side of the cover 10, the particles scatter. However, the scattering particles are easily discharged to the transfer chamber 11 along the flow of the dry gas since the flow rate of the dry gas supplied from the gas supply port 30 at the cover 10 side is low at that time. When the flow rate of the dry gas supplied from the gas supply port 30 at the cover 10 side reaches the first flow rate after a predetermined period of time elapses, the re-scattering particles are already discharged to the transfer chamber 11. Therefore, when the flow rate of the dry gas needs to be increased, it is sufficient to ramp-control at least the dry gas supplied from the gas supply port 30 at the cover 10 side.

Next, the effect of ramping control in the case of varying the flow rate of the dry gas from the gas supply port 30 at the cover 10 side within the range from about 0 mL/min to 60 mL/min and that of the dry gas from the gas supply port 30 at the opposite side of the cover 10 within the range from about 30 mL/min to 100 mL/min will be described with reference to FIGS. 9 and 10. FIG. 9 is a table showing a result of counting the number of particles adhered to the wafer W in the case of controlling the flow rate of the dry gas by operating the cut-off valves 41 and 42 as in the case shown in FIG. 3. FIG. 10 is a table showing the number of particles adhered to the wafer W in the case of gradually increasing the flow rate of the dry gas by using the flow rate control unit 80 as in the case shown in FIG. 6. The dry gas supplied from the gas supply port 30 at the opposite side of the cover 10 is not subjected to ramp control.

Numerical values written in each cell in the tables of FIGS. 9 and 10 represent the number of counted particles on the $1^{st}$ wafer, the $13^{th}$ wafer and the $25^{th}$ wafer from left to right. In FIGS. 9 and 10, the flow rate of the dry gas from the gas supply port 30 at the cover 10 side is referred to as "front flow rate" and the flow rate of the dry gas from the gas supply port 30 at the opposite side of the cover 10 is referred to as "rear flow rate". The diameter of the particles as counting targets is about 0.09 μm or above as in the case shown in FIG. 8.

When the flow rate of the dry gas is adjusted by operating the cut-off valves 41 and 42 as shown in FIG. 9, the number of particles tends to be increased as the amount of the front flow rate is increased. On the assumption that a wafer is determined to be defective when the number of particles adhered thereto is greater than or equal to 10, it has been found that a defective wafer occurred regardless of the rear flow rate when the front flow rate was 60 mL/min. It has been also found that even when the front flow rate was 50 mL/min, a defective wafer occurred if the rear flow rate was about 30 mL/min, i.e., about a half of the front flow rate.

Further, when the flow rate of the dry gas was ramp-controlled by the flow rate control unit 80, it has been found that the defective wafer did not occur regardless of the rear flow rate when the front flow rate was 50 mL/min or less as shown in FIG. 10. It has been also found that even when the front flow rate was 60 mL/min, the defective wafer did not occur if the rear flow rate was 80 mL/min or above. This is, as described above, because re-scattering of the particles in the substrate container 1 is reduced by gradually increasing the flow rate of the dry gas, and, also, the re-scattering particles are discharged to the transfer chamber 11 without being disturbed by the dry gas from the gas supply port 30 at the cover 10 side.

Figure 11:
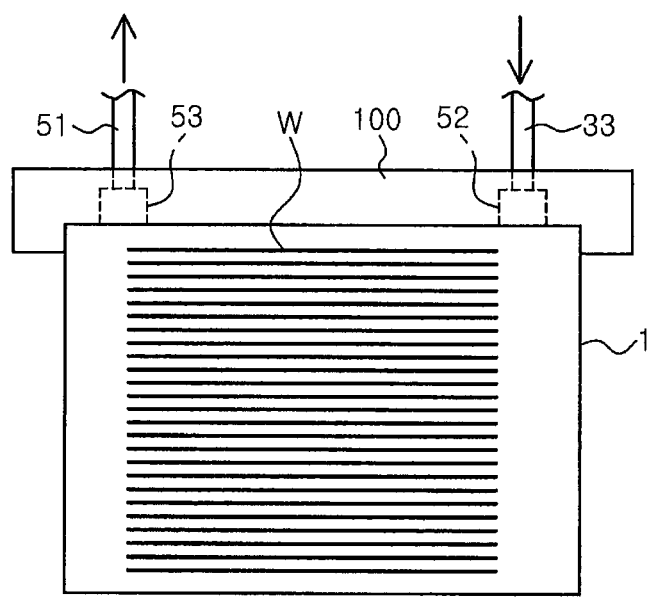
FIG. 11 is a schematic vertical sectional view showing a schematic configuration of another substrate container.

In the above-described embodiments, the gas supply port and the gas exhaust port 31 are provided at the bottom portion of the substrate container 1. However, the gas supply port 30 and the gas exhaust port 31 may be provided at, e.g., the ceiling portion of the substrate container 1. In that case, as shown in FIG. 11, the gas supply line 33 and the gas exhaust line 51 may be provided at a transfer unit 100 for transferring the substrate container 1 while holding the upper portion thereof, and the inside of the substrate container 1 may be purged while the substrate container 1 is being transferred to the mounting table 13. By doing so, purging is unnecessary during, e.g., time t7 to t8, which may lead to improvement of a throughput of the wafer processing. A purge process in this case is also the same as the purge process shown in FIG. 4, except in that purging is omitted during time t7 to t8 and in that pre-purge during time t1 to t2 is performed before the substrate container 1 is transferred by the transfer unit 100. Further, it is preferable to provide the sensor 70, which forcibly terminates pre-purge for safety, at the transfer unit 100 or the like.

In the above-described embodiments, the cover 10 is in an open state during the plasma etching of the wafer W, i.e., during the period of time t11 to t12. However, when the wafer W is not loaded into or unloaded from the substrate container 1 for a predetermined period of time during the plasma etching, the cover 10 may be closed. By doing so, the humidity in the substrate container 1 is decreased, so that the wafers W in the substrate container 1 can be maintained in a good state.

While the invention has been shown and described with respect to the embodiments, it will be understood by those skilled in the art that various changes and modifications may be made without departing from the scope of the invention as defined in the following claims.

What is claimed is:

1. A substrate container purging method comprising:
   mounting a substrate container, which accommodates in multiple stages a plurality of substrates to be processed by a substrate processing apparatus, on a mounting unit;
   starting supply of a dry gas into the substrate container from a gas supply line before opening a cover of the substrate container;
   opening the cover of the substrate container while keeping the supply of the dry gas;
   closing the cover of the substrate container after all the substrates are processed and returned back into the substrate container; and
   stopping the supply of the dry gas after closing the cover of the substrate container,
   wherein, before said opening, the dry gas is supplied at a first flow rate and then at a second flow rate smaller than the first flow rate; and
   wherein said starting the supply of the dry gas into the substrate container includes supplying the dry gas under a control of a control device such that a flow rate of the dry gas reaches the first flow rate at a predetermined ramp rate for a predetermined period of time.

2. The method of claim 1, wherein before the substrate container is mounted on the mounting unit, an inside of the gas supply line is purged by the dry gas.

3. The method of claim 2, further comprising providing a distribution line inside the substrate container,
   wherein the distribution line has multiple openings arranged with vertical gaps therebetween, and
   wherein the dry gas is supplied into the substrate container through the distribution line.

4. The method of claim 3, wherein each opening at an upper portion of the distribution line is greater than each opening at a lower portion of the distribution line, and
   wherein a flow rate of the dry gas flowing through the upper portion of the distribution line greater than a flow rate of the dry gas flowing though the lower portion of the distribution line.

5. The method of claim 1, wherein the dry gas is supplied through a gas supply port formed at a bottom portion of the substrate container and the dry gas supplied into the substrate container is discharged via a gas exhaust port formed at the bottom portion Of the substrate container.

6. The method of claim 1, wherein the dry gas is supplied through a gas supply port formed at a ceiling portion of the substrate container and the dry gas supplied into the substrate container is discharged via a gas exhaust port formed at the ceiling portion of the substrate container.

7. The method of claim 1, wherein the dry gas is supplied into the substrate container through one or more rear gas supply port disposed away from the cover and one or more front gas supply ports positioned between the cover and the rear gas supply ports, and wherein a flow rate of the dry gas supplied from the front gas supply ports is smaller than that of the dry gas supplied from the rear gas supply ports.

8. The method of claim 1, wherein the dry gas is supplied into the substrate container through one or more rear gas supply ports disposed away from the cover and one or more front gas supply ports positioned between the cover and the rear gas supply ports, and wherein a flow rate of the dry gas supplied from the front gas supply ports is gradually increased at a predetermined ramp rate for a predetermined period of time under a control of a control device.

9. The method of claim 1, wherein, after said opening, the dry gas is supplied at a third flow rate smaller than or equal to the first flow rate and greater than the second flow rate, and then the dry gas is supplied at a fourth flow rate smaller than the third flow rate and greater than or equal to the second flow rate before said closing.

10. The method of claim 9, wherein, a flow rate of the dry gas starts increasing with a predetermined ramp rate from the second flow rate at the beginning of said opening until the flow rate reaches the third flow rate.

11. The method of claim 9, wherein, after said closing, a flow rate of the dry gas is increased from the fourth flow rate and a post purge is performed at the first flow rate and the third flow rate.

* * * * *